(12) United States Patent
Chang et al.

(10) Patent No.: US 12,078,607 B2
(45) Date of Patent: Sep. 3, 2024

(54) WIDE-BANDGAP SEMICONDUCTOR LAYER CHARACTERIZATION

(71) Applicant: Taiwan Semiconductor Manufacturing Company Limited, Hsinchu (TW)

(72) Inventors: Chih-Yu Chang, New Taipei (TW); Ken-Ichi Goto, Hsinchu (TW); Yen-Chieh Huang, Changhua County (TW); Min-Kun Dai, Hsinchu (TW); Han-Ting Tsai, Kaoshiung (TW); Sai-Hooi Yeong, Zhubei (TW); Yu-Ming Lin, Hsinchu (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 226 days.

(21) Appl. No.: 17/569,680

(22) Filed: Jan. 6, 2022

(65) Prior Publication Data

US 2023/0050640 A1 Feb. 16, 2023

Related U.S. Application Data

(60) Provisional application No. 63/232,235, filed on Aug. 12, 2021.

(51) Int. Cl.
| | |
|---|---|
| *G01N 27/22* | (2006.01) |
| *G01R 31/24* | (2020.01) |
| *G01R 31/26* | (2020.01) |
| *H01L 21/66* | (2006.01) |
| *H01L 27/14* | (2006.01) |

(52) U.S. Cl.
CPC ......... *G01N 27/221* (2013.01); *G01R 31/24* (2013.01); *G01R 31/2648* (2013.01); *H01L 22/14* (2013.01); *H01L 27/14* (2013.01)

(58) Field of Classification Search
CPC .. G01N 27/221; G01R 31/2648; G01R 31/26; H01L 22/14; H01L 27/14; H01L 27/04
See application file for complete search history.

(56) References Cited

U.S. PATENT DOCUMENTS

| | | | |
|---|---|---|---|
| 11,009,525 B1 * | 5/2021 | Mody | ................ G01B 11/285 |
| 2014/0017826 A1 * | 1/2014 | Okano | ................... H01L 22/14 |
| | | | 438/18 |
| 2021/0171714 A1 * | 6/2021 | Miura | ................ C08G 73/1039 |

* cited by examiner

*Primary Examiner* — Amy He
(74) *Attorney, Agent, or Firm* — The Marbury Law Group, PLLC

(57) ABSTRACT

A method of characterizing a wide-bandgap semiconductor material is provided. A substrate is provided, which includes a layer stack of a conductive material layer, a dielectric material layer, and a wide-bandgap semiconductor material layer. A mercury probe is disposed on a top surface of the wide-bandgap semiconductor material layer. Alternating-current (AC) capacitance of the layer stack is determined as a function of a variable direct-current (DC) bias voltage across the conductive material layer and the wide-bandgap semiconductor material layer. A material property of the wide-bandgap semiconductor material layer is extracted from a profile of the AC capacitance as a function of the DC bias voltage.

20 Claims, 7 Drawing Sheets

WIDE-BANDGAP SEMICONDUCTOR LAYER CHARACTERIZATION

RELATED APPLICATIONS

This application claims the benefit of priority from U.S. Provisional Application No. 63/232,235 titled "Wide Bandgap Semiconductor Wafer Level Film Parameter Extraction" and filed on Aug. 12, 2021, the entire contents of which are incorporated herein by reference for all purposes.

BACKGROUND

Characterization of wide-bandgap semiconductor materials is difficult because properties of the wide-bandgap semiconductor materials are sensitive to changes in the material composition and microstructural properties of the wide-bandgap semiconductor materials. In other words, small changed in composition or microstructure in wide-bandgap semiconductor materials may result in significant changes in electrical properties of the wide-bandgap semiconductor materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
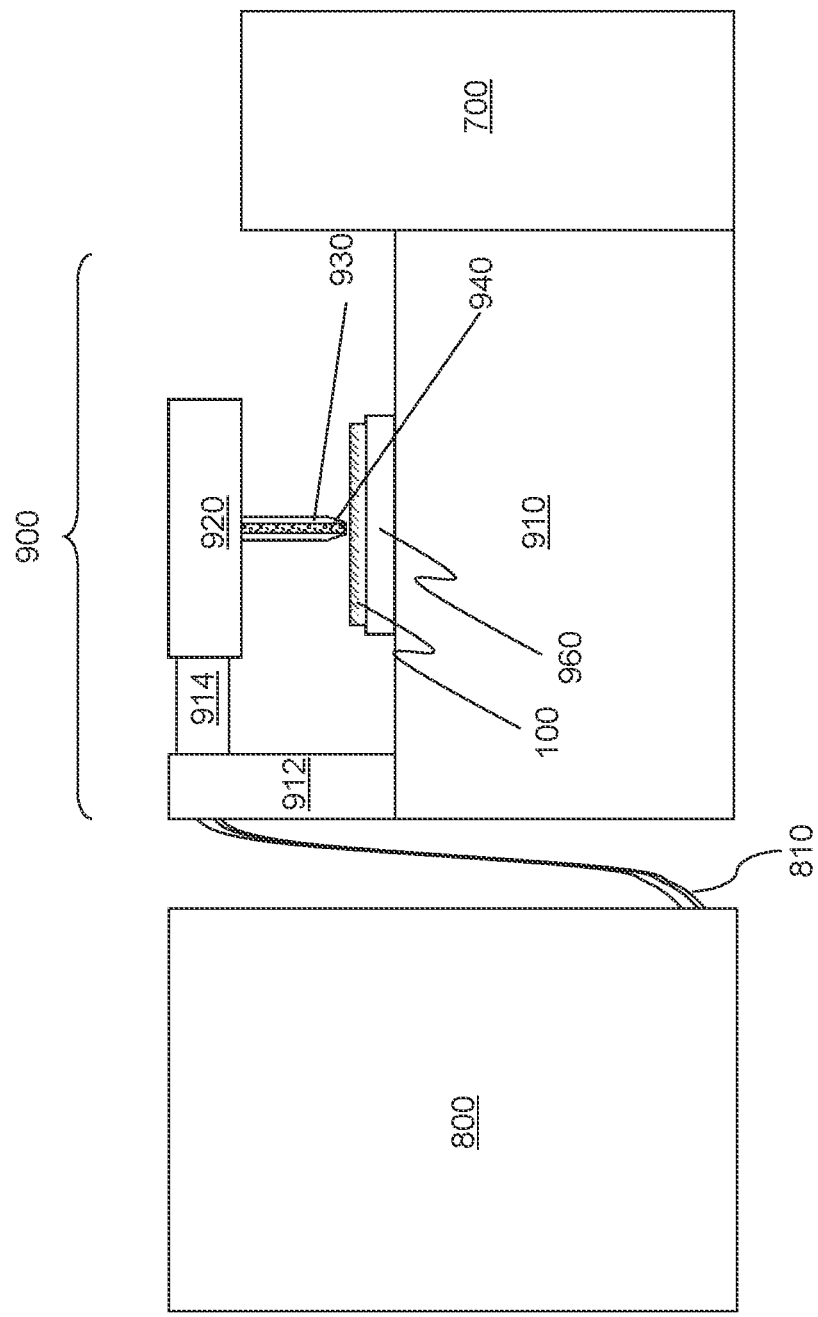
FIG. 1 is a schematic view of an exemplary test setup using a test apparatus according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Measurement of charge carrier concentration in compound semiconductor materials having a wide bandgap may not be extracted from an ideal diode contact due to high density of surface states (Dit) and due to low signal-to-noise ratio during small signal capacitance-voltage measurements. Embodiments of the present disclosure use a low-resistance metallic contact using a liquid phase metal. Specifically, a mercury probe contact may be used to provide wafer-level measurements without any need to form patterned structures. Thus, embodiments of the present disclosure provide for the extraction of charge carrier concentration from wide-bandgap semiconductor materials without using lithographic patterning steps. Thus, electrical properties of a wide-bandgap semiconductor film may be monitored immediately after deposition of a wide-bandgap semiconductor film to provide real-time feedback on the wide-bandgap semiconductor film deposition processes.

Referring to FIG. 1, an exemplary test setup using a test apparatus is illustrated. The test apparatus may include a tester electronics unit 800 including at least one computer and peripheral devices, a wafer prober 900 in communication with the tester electronics unit 800, for example, via signal and power cables 810, and an optional wafer conveyer unit 700 configured to load and unload wafers 100 to be tested on the wafer prober 900. The wafer prober 900 comprises a wafer chuck 960 configured to hold a wafer 100 thereupon, a prober frame 910 containing a stage drive unit configured to laterally drive the wafer chuck 960, a tester head 920 that overlies the wafer chuck 960, and tester head support structures (912, 914) configured to structurally support, and to provide movement to, the tester head 920.

According to an aspect of the present disclosure, the test apparatus comprises a mercury probe (930, 940) attached to the tester head 920 and configured to provide a low-resistance electrical contact with a top surface of the wafer 100. The mercury probe (930, 940) may include a pillar 930 of mercury that is contained in a capillary tube 940. The tester head 920 may be configured to provide a vacuum manifold connected to the capillary tube 940 and configured to control the vertical extent of the pillar 930 of mercury in the capillary tube 940. Specifically, the bottom surface of the pillar 930 of mercury may be lowered during measurement so that the pillar 930 of mercury may be in contact with a top surface of the wafer 100 during measurement. The bottom surface of the pillar 930 may be raised before, and after, the measurement step while the mercury probe (930, 940) is not in contact with the top surface of the wafer 100.

Figure 2:
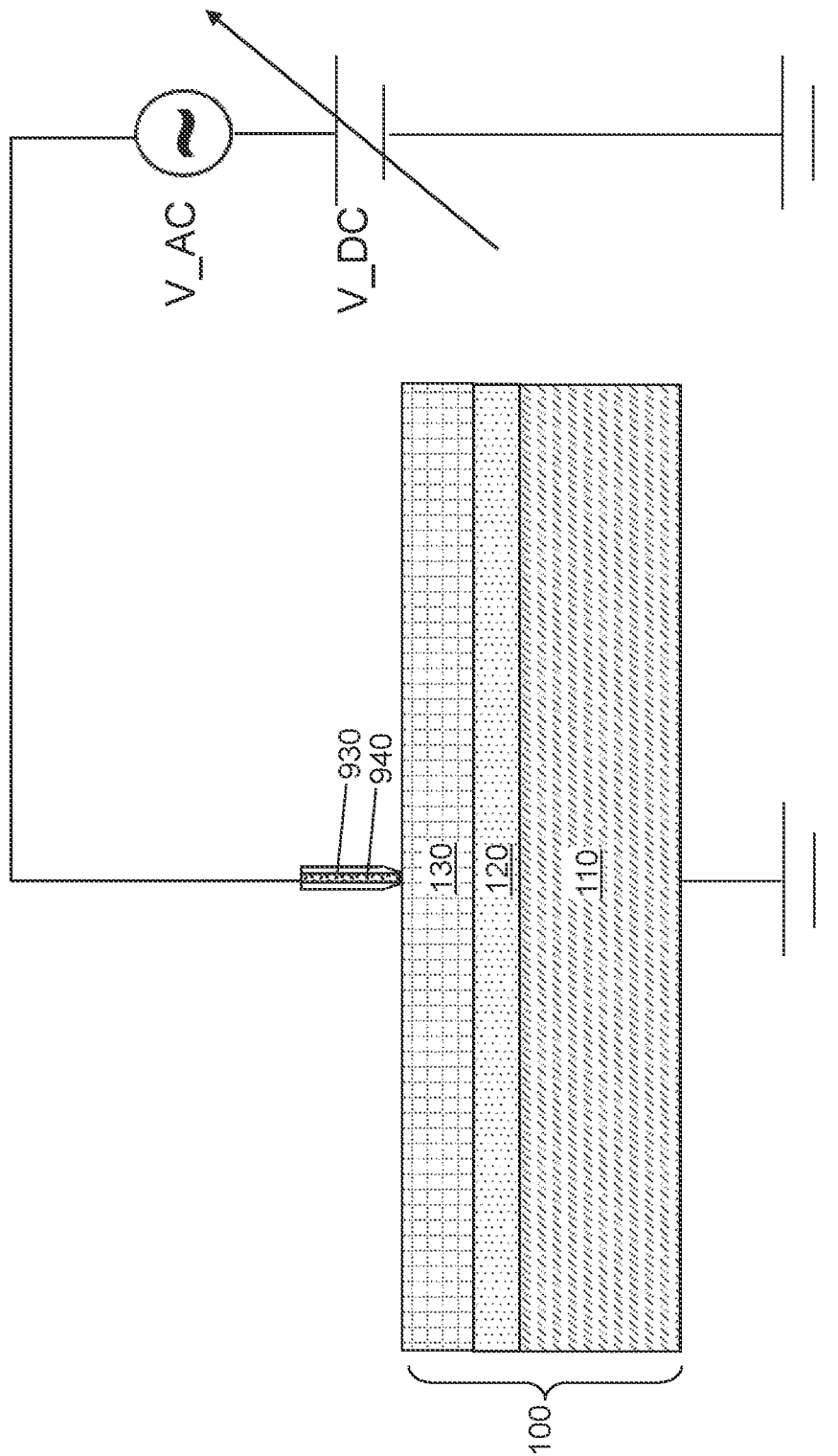
FIG. 2 is a composite view including a vertical cross-sectional view of a wafer and a mercury probe and a circuit schematic for electrically biasing the combination of the wafer and the mercury probe according to an embodiment of the present disclosure.

Referring to FIG. 2, a composite view is shown, which includes a vertical cross-sectional view of the wafer 100 and the mercury probe (930, 940) of FIG. 1, and a circuit schematic for electrically biasing the combination of the wafter 100 and the mercury probe (930, 940). The wafer 100 may include a conductive material layer 110, which may be a heavily doped single crystalline semiconductor material layer or a heavily doped polycrystalline semiconductor material layer. In one embodiment, the conductive material layer 110 may include a commercially available single crystalline semiconductor substrate including p-type dopants or n-type dopants at a level that renders the single crystalline semiconductor substrate electrically conductive.

In one embodiment, the conductive material layer 110 may include a heavily-doped semiconductor material layer including p-type dopants or n-type dopants at an atomic concentration in a range from $5.0\times10^{19}/cm^3$ to $2.0\times10^{21}/cm^3$, such as from $1.0\times10^{20}/cm^3$ to $1.0\times10^{21}/cm^3$. In one embodiment, the conductive material layer 110 may include a heavily-doped semiconductor material layer having electrical conductivity greater than $1.0\times10^4$ S/cm and/or greater than $1.0\times10^5$ S/cm. Alternatively, the conductive material layer 110 may include a metallic material layer such as a conductive metallic nitride layer including a conductive metallic nitride material (such as TiN, TaN, or WN), or a metal layer including an elemental metal (such as a transition metal) or an intermetallic alloy of at least two metallic elements.

In one embodiment, the conductive material layer 110 may include a doped single crystalline semiconductor material layer or a doped polycrystalline semiconductor material layer, and may include p-type dopants or n-type dopants at an atomic concentration in a range from $5.0\times10^{19}/cm^3$ to $2.0\times10^{21}/cm^3$. In one embodiment, the conductive material layer 110 may be the entirety of a wafer such as a commercially available semiconductor wafer including p-type dopants or n-type dopants at an atomic concentration in a range from $5.0\times10^{19}/cm^3$ to $2.0\times10^{21}/cm^3$, such as from $1.0\times10^{20}/cm^3$ to $1.0\times10^{21}/cm^3$, and having a thickness in a range from 300 microns to 1 mm.

Alternatively, the conductive material layer 110 may be a surface layer deposited on a handle substrate and having a thickness in a range from 100 nm to 1 microns. In this embodiment, the handle substrate may include a semiconductor substrate, an insulating substrate, or a conductive substrate. According to an aspect of the present disclosure, the conductive material layer 110 may be electrically grounded for the purpose of generating electrical test data.

The wafer 100 may be provided by sequentially depositing a dielectric material layer 120 and a compound semiconductor material layer 130. The dielectric material layer 120 may include any dielectric metal oxide material that may be used as a gate dielectric for a thin film transistor (TFT). In one embodiment, the dielectric material layer 120 may include a dielectric metal oxide material having a dielectric constant greater than 7.9. In this embodiment, the dielectric material layer 120 may include a dielectric metal oxide layer. In one embodiment, the dielectric material layer 120 may include a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. The dielectric material layer 120 may be deposited by atomic layer deposition or chemical vapor deposition although other suitable deposition processes may be used. The thickness of the dielectric material layer 120 may be in a range from 1.5 nm to 100 nm, such as from 4 nm to 50 nm, although lesser and greater thicknesses may also be used.

The compound semiconductor material layer 130 may include a wide-bandgap semiconductor material layer that includes an amorphous wide-bandgap semiconductor material, i.e., a semiconductor material having a bandgap of 2.0 eV or greater. In one embodiment, the compound semiconductor material layer 130 may include a material selected from indium gallium zinc oxide (IGZO), tin indium gallium zinc oxide, silicon-doped IGZO, indium tungsten oxide, indium zinc oxide, gallium zinc oxide, indium tin oxide, tin germanium oxide, gallium oxide, indium oxide, zinc oxide, doped indium oxide (such as tungsten-doped indium oxide), doped cadmium oxide, nickel oxide, tin oxide, copper oxide, gallium nitride, aluminum gallium arsenide, gallium arsenide, indium gallium arsenide, silicon carbide, and compounds thereof. The compound semiconductor material layer 130 may be deposited by physical vapor deposition although other suitable deposition processes may be used.

The compound semiconductor material layer 130 may have a uniform thickness throughout. The thickness of the compound semiconductor material layer 130 may be in a range from 2 nm to 100 nm, such as from 6 nm to 40 nm, although lesser and greater thicknesses may also be used. In one embodiment, the compound semiconductor material layer 130 may have a uniform thickness throughout, and may include free charge carriers at an atomic concentration that is less than the atomic concentration of the p-type dopants or the n-type dopants within the doped semiconductor material layer that may include the conductive material layer 110. In one embodiment, the compound semiconductor material layer 130 may comprises free charge carriers at an atomic concentration in a range from $1.0\times10^{15}/cm^3$ to $1.0\times10^{21}/cm^3$.

In one embodiment, the conductive material layer 110 may have a higher electrical conductivity than the compound semiconductor material layer 130 so that subsequently capacitive measurements to be performed according to embodiments of the present disclosure measure electrical properties of the compound semiconductor material layer 130 with little impact from the electrical characteristics of the conductive material layer 110. In other words, the conductive material layer 110 may be more conductive than the compound semiconductor material layer 130 for the purpose of subsequent capacitive measurements to be subsequently performed, and the capacitive measurements characterize the electrical properties of the compound semiconductor material layer 130, and is insensitive to the electrical properties of the conductive material layer 110.

According to an embodiment of the present disclosure, the dielectric material layer 120 and the compound semiconductor material layer 130 do not need to be patterned to provide the test structure illustrated in FIG. 2. Thus, the dielectric material layer 120 may be an un-patterned material layer having the same area as the conductive material layer 110, and the compound semiconductor material layer 130 may be an un-patterned material layer having the same area as the conductive material layer 110.

According to an aspect of the present disclosure, the wafer 100 may include a capacitive structure including a vertical stack of the conductive material layer 110, the dielectric material layer 120, and the compound semiconductor material layer 130 (which is a wide-bandgap semiconductor material layer). Thus, the capacitive structure may be formed within an un-patterned substrate having a same layer stack throughout the entire area of the wafer 100.

A tip of a mercury probe (930, 940) may be disposed on a top surface of the compound semiconductor material layer 130 (i.e., the wide-bandgap semiconductor material layer). The mercury probe (930, 940) may include a pillar 930 of mercury that is contained in a capillary tube 940. Upon contact of the bottom surface of the capillary tube 940, the pillar 930 of mercury may be lowered to come in direct contact with the top surface of the compound semiconductor material layer 130 (i.e., the wide-bandgap semiconductor material layer). In one embodiment, the contact area between the pillar 930 of mercury and the top surface of the compound semiconductor material layer 130 may be in a range from 0.5 mm$^2$ to 10 mm$^2$, and/or from 1.0 mm$^2$ to 5 mm$^2$.

An electrical bias circuit may be provided in the test apparatus. A signal node of the electrical bias circuit may be connected to the pillar 930 of the mercury probe (930, 940), and the ground node of the electrical bias circuit may be connected to the electrical ground. The electrical bias circuit may include a series connection of a variable direct-current (DC) bias circuit configured to provide a variable direct-current bias voltage V_DC, and an alternating-current (AC) bias circuit configured to provide an alternating-current (AC) perturbation voltage V_AC.

In one embodiment, the variable DC bias voltage V_DC may have a minimum voltage that is less than −2 V and has a maximum voltage that is greater than 2 V. In one embodiment, the variable DC bias voltage V_DC may have a negative minimum voltage and a positive maximum voltage, and the absolute value of the negative minimum voltage and the value of the positive maximum voltage may be greater than the band gap energy of the semiconductor material of the compound semiconductor material layer 130 divided by the charge of an electron (i.e., the unit charge). In one embodiment, the minimum value of the variable DC bias voltage V_DC may be in a range from −10 V to −2 V, and the maximum value of the variable DC bias voltage V_DC may be in a range from 2 V to 10 V.

In one embodiment, the AC perturbation voltage V_AC may include a sinusoidal perturbation voltage having a frequency in a range from 10 Hz to 1 GHz. According to an embodiment of the present disclosure, the frequency of the AC perturbation voltage V_AC may be a variable that is selected within the range of the values of the frequency for the AC perturbation voltage V_AC. In other words, the AC bias circuit may be configured to provide the AC perturbation voltage V_AC at multiple frequencies.

In some embodiments, at least two frequency values may be used for multiple AC capacitance measurement of the layer stack within the wafer 100 such that each frequency value differs from all other frequency values at least by a factor of 100, or at least by a factor of 10. In some embodiments, at least three frequency values may be used for multiple AC capacitance measurement of the layer stack within the wafer 100 such that each frequency value differs from all other frequency values at least by a factor of 100, or at least by a factor of 10. In some embodiments, at least four frequency values may be used for multiple AC capacitance measurement of the layer stack within the wafer 100 such that each frequency value differs from all other frequency values at least by a factor of 100, or at least by a factor of 10. In some embodiments, at least two frequency values may be used for multiple AC capacitance measurement of the layer stack within the wafer 100 such that at least one frequency value is in a range from 10 Hz to 100 Hz, and at least another frequency value is in a range from 10 MHz to 1 GHz. Generally, two or more values of the frequency may be used to measure a low frequency response and a high frequency response of the AC capacitance as a function of the variable DC bias voltage V_DC.

The amplitude of the AC perturbation voltage V_AC is selected to be at least an order of magnitude less than the range of the variable DC bias voltage V_DC, i.e., less than the difference between the maximum value of the variable DC bias voltage V_DC and the minimum value of the variable DC bias voltage V_DC so that the effect of the DC bias voltage is dominant over the voltage variations due to the AC perturbation voltage within the entire range of the applied voltage at the mercury probe (930, 940). Further, the amplitude of the AC perturbation voltage V_AC is selected to be large enough to provide a sufficient high signal-to-noise ratio. In one embodiment, the AC perturbation voltage may have an amplitude in a range from 5 mV to 50 mV, such as from 10 mV to 25 mV.

The alternating-current (AC) capacitance of the layer stack of the conductive material layer 110, the dielectric material layer 120, and the compound semiconductor material layer 130 may be measured at multiple values of a direct-current (DC) bias voltage across the conductive material layer 110 and the compound semiconductor material layer 130. Specifically, the AC capacitance may be measured as a function of the variable direct-current (DC) bias voltage by applying a combination of the variable DC bias voltage and the AC perturbation voltage across the mercury probe (930, 940) and the conductive material layer 110 (which may comprise a doped silicon substrate) at multiple values of the variable DC bias voltage.

According to an aspect of the present disclosure, the mercury probe (930, 940) enables low resistance electrical contact with the non-Ohmic material of the compound semiconductor material layer 130 (i.e., the wide-bandgap semiconductor material layer). A typical metal-tip probe generates a Schottky barrier upon contact with a compound semiconductor material. The Schottky barrier is significantly high due to the wide bandgap of the compound semiconductor material layer 130, which is a wide-bandgap semiconductor material layer. The deleterious effect of the Schottky barrier generated by a typical metal-tip probe contact may be worse for wide-bandgap semiconductor materials than for silicon, germanium, or silicon-germanium alloys. The pillar 930 of mercury in the mercury probe (930, 940) has the effect of significantly reducing the Schottky barrier, and thus, reduces the contact resistance between the pillar 930 of mercury and the compound semiconductor material layer 130 to a level at which the measured AC capacitance reliably provides a high signal-to-noise ratio that is not affected by the low contact resistance between the pillar of mercury and the compound semiconductor material layer 130.

Thus, the combination of the variable DC bias voltage and the AC perturbation voltage may be applied across the conductive material layer 110 and the compound semiconductor material layer 130 (which is a wide-bandgap semiconductor material layer) without voltage drop at the junction between the compound semiconductor material layer 130 and the mercury probe (930, 940). The AC capacitance of the layer stack of the conductive material layer 110, the dielectric material layer 120, and the compound semiconductor material layer 130 may be determined as a function of the variable direct-current (DC) bias voltage for each selected frequency value of the AC perturbation voltage.

Figure 3:
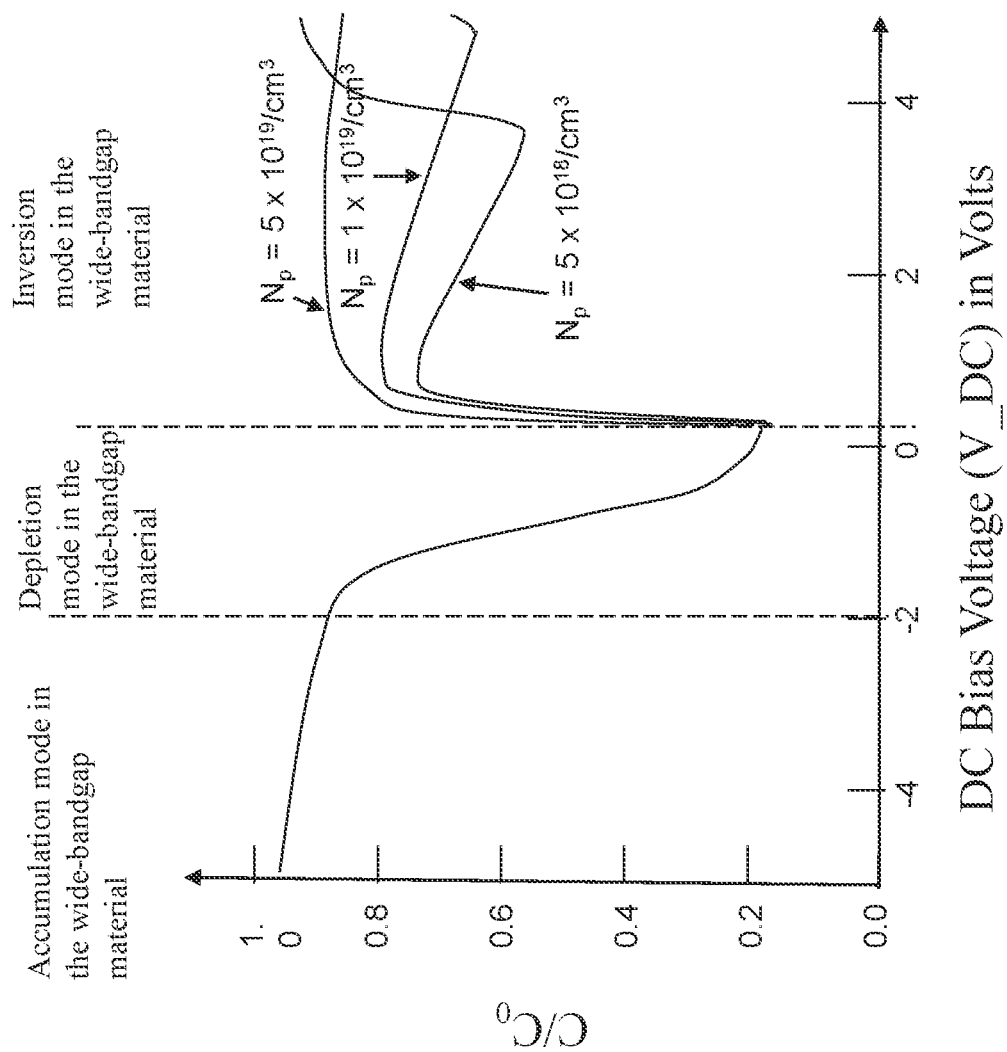
FIG. 3 is a graph illustrating extraction of a free charge carrier density from exemplary alternating-current (AC) capacitance measurement results as a function of a direct-current (DC) bias voltage according to an embodiment of the present disclosure.

Referring to FIG. 3, three exemplary AC capacitance curves as a function of a direct-current (DC) bias voltage are illustrated for three different samples, which differ from one another by the charge carrier concentration in the compound semiconductor material layer 130. The frequency value for the AC perturbation voltage is the same for the three exemplary AC capacitance values, and is about 1 kHz. Portions of the AC capacitance curves in the inversion mode are sensitive to the atomic concentration of charge carriers, which is p-type charge carriers in the illustrated example.

Generally, the capacitor structure including the layer stack of the conductive material layer 110, the dielectric material layer 120, and the compound semiconductor material layer 130 exhibits three characteristic modes: the accumulation mode, the depletion mode, and the inversion mode. In the accumulation mode, free charge carriers in the compound semiconductor material layer 130 are attracted to a surface region of the compound semiconductor material layer 130 in proximity to the interface with the dielectric material layer 120. In the depletion mode, the free charge carriers are repelled from the surface region of the compound semiconductor material layer 130 in proximity to the interface with the dielectric material layer 120, thereby forming a depletion layer in which the free charge carriers are absent. In the inversion mode, the applied DC bias voltage attracts minority charge carriers (which are electrons in p-type semiconductor materials, or holes in n-type semiconductor materials) to the surface region of the compound semiconductor material layer 130 in proximity to the interface with the dielectric material layer 120, thereby forming an inversion layer.

According to an aspect of the present disclosure, the profile of the AC capacitance of the layer stack of the conductive material layer 110, the dielectric material layer 120, and the compound semiconductor material layer 130 as a function of the DC bias voltage in the inversion mode is sensitive to some material properties of the wide-bandgap semiconductor material in the compound semiconductor material layer 130. Thus, a material property of the compound semiconductor material layer 130 may be extracted from a profile of the AC capacitance as a function of the DC bias voltage.

In one embodiment, the material property that may be extracted from a profile of the AC capacitance as a function of the DC bias voltage may include a free charge carrier concentration within the compound semiconductor material layer 130. In the example illustrated in FIG. 3, compound semiconductor material layer 130 including a respective a p-type compound semiconductor material having different free carrier concentrations of $5.0\times10^{18}/cm^3$, $1.0\times10^{19}/cm^3$, or $5.0\times10^{19}/cm^3$ exhibit different AC capacitance profiles in the inversion mode. Thus, the carrier concentration in a compound semiconductor material layer 130 may be determined based on a profile of the AC capacitance as the function of the variable DC bias voltage. Generally, the range of the free charge carrier concentration within the compound semiconductor material layer 130 that may be determined by this method in a range from $1.0\times10^{15}/cm^3$ to $1.0\times10^{21}/cm^3$, such as from $1.0\times10^{15}/cm^3$ to $1.0\times10^{20}/cm^3$, and/or from $1.0\times10^{15}/cm^3$ to $5.0\times10^{19}/cm^3$. The conductive material layer 110 that is electrically grounded may have a higher electrical conductivity than the compound semiconductor material layer 130 that is contacted by the mercury probe (930, 940) such that the measured AC capacitance is limited by the electrical properties of the compound semiconductor material layer 130, and extraction of the material properties of the compound semiconductor material layer 130. In other words, the extracted material properties are the material properties of the compound semiconductor material layer 130 that is directly contacted by the mercury probe (930, 940).

In one embodiment, the material property that may be extracted from a profile of the AC capacitance as a function of the DC bias voltage may include a resistivity of the compound semiconductor material in the compound semiconductor material layer 130. In one embodiment, the material property that may be extracted from a profile of the AC capacitance as a function of the DC bias voltage may include a sheet resistance of the compound semiconductor material in the compound semiconductor material layer 130. In one embodiment, the material property that may be extracted from a profile of the AC capacitance as a function of the DC bias voltage may include a thickness of the compound semiconductor material in the compound semiconductor material layer 130. In this embodiment, the sheet resistance of the compound semiconductor material in the compound semiconductor material layer 130 may be measured using a different measurement technique (such as a four-point probe resistance measurement), and the measured sheet resistance may be used in conjunction with the extracted resistivity of the compound semiconductor material in the compound semiconductor material layer 130 to determine the thickness. In one embodiment, the material property that may be extracted from a profile of the AC capacitance as a function of the DC bias voltage may include a dopant concentration in the compound semiconductor material in the compound semiconductor material layer 130, which may be the same as, or may be correlated with, the free carrier density.

According to an aspect of the present disclosure, for a given layer stack including a conductive material layer 110, a dielectric material layer 120, and a compound semiconductor material layer 130 within a wafer 100, a plurality of AC capacitance curves as a function of the DC bias voltage may be generated for multiple values of the frequency of the AC perturbation voltage.

Figure 4:
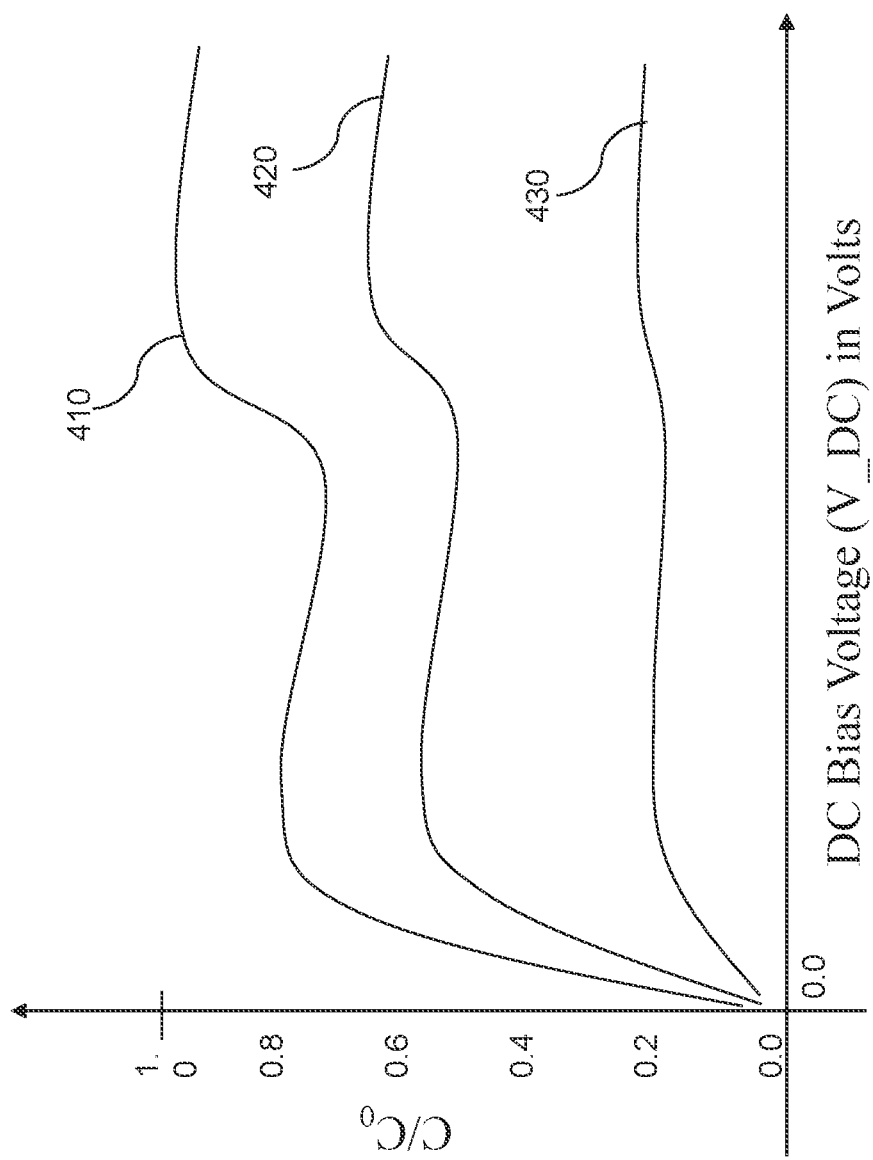
FIG. 4 is a graph illustrating the AC capacitance dependence curves on the measurement frequency according to an embodiment of the present disclosure.

Referring to FIG. 4, an exemplary set of multiple AC capacitance curves (410, 420, 430) generated as a function of a DC bias voltage for a same layer stack including a conductive material layer 110, a dielectric material layer 120, and a compound semiconductor material layer 130 within a wafer 100 is illustrated. The AC capacitance curves (410, 420, 430) may include a first AC capacitance curve 410 that is generated at a first frequency value of the AC perturbation voltage, a second AC capacitance curve 420 that is generated at a second frequency value of the AC perturbation voltage, and a third AC capacitance curve 430 that is generated at a third frequency value of the AC perturbation voltage. In an illustrative example, the first frequency value may be 100 Hz, the second frequency value may be 100 kHz, and the third frequency value may be 100 MHz.

Generally, a set of two or more AC capacitance curves may be generated for a same layer stack including a conductive material layer 110, a dielectric material layer 120, and a compound semiconductor material layer 130 within a wafer 100. The selected frequency values for the AC perturbation voltage may be in a range from 10 Hz to 1 GHz, and are spaced from one another to provide at least one low-frequency AC capacitance characteristic in the inversion mode, at least one high-frequency AC capacitance characteristic in the inversion mode, and optionally, at least one medium-frequency AC capacitance characteristic in the inversion mode.

In one embodiment, each frequency value may differ from all other frequency values at least by a factor of 100, or at least by a factor of 10. In another embodiment, each frequency value may differ from all other frequency values at least by a factor of 100, or at least by a factor of 10. In one embodiment, each frequency value may differ from all other frequency values at least by a factor of 100, or at least by a factor of 10. In one embodiment, at least one frequency value is in a range from 10 Hz to 100 Hz, and at least another frequency value is in a range from 10 MHz to 1 GHz. Generally, two or more values of the frequency may be used to measure a low frequency response and a high frequency response of the AC capacitance as a function of the variable DC bias voltage V_DC.

It should be noted that a same charge carrier concentration in different compound semiconductor materials does not necessarily generate the same AC capacitance curve at a same frequency value for the AC perturbation voltage. This is because the electronic properties in wide-bandgap semiconductor materials may be affected by other parameters than the free charge carrier concentration. Such parameters include porosity, crystallinity, and stoichiometry of the compound semiconductor materials. Thus, a set of compound semiconductor material layers including a same base compound semiconductor material and having different material properties may be generated and analyzed, for example, for compositional analysis and for microstructural analysis. A set of wafers 100 including a respective layer stack containing a respective conductive material layer 110, a respective dielectric material layer 120, and a respective compound semiconductor material layer 130 may be manufactured such that each compound semiconductor material layer 130 has a same material composition and structural properties as a corresponding compound semiconductor material layer as analyzed for compositional analysis and for microstructural analysis. A set of AC capacitance curves may be generated for multiple frequency values of the AC perturbation voltage for each wafer 100 within the set of wafers 100. The features in the AC capacitance curves may be correlated with the material properties of the corresponding compound semiconductor material layer as obtained from the compositional analysis and from the microstructural analysis. Once the database correlating the features in the AC capacitance curves and the material properties of a compound semiconductor material layer having a base composition is established, new films of the compound semiconductor material having the same base composition may be monitored by manufacturing a new wafer 100 including a layer stack containing a conductive material layer 110, a dielectric material layer 120, and a compound semiconductor material layer 130, by generating a set of multiple AC capacitance curves for multiple values of frequencies for the AC perturbation voltage, and by extracting material properties from the set of multiple AC capacitance curves.

Figure 5:
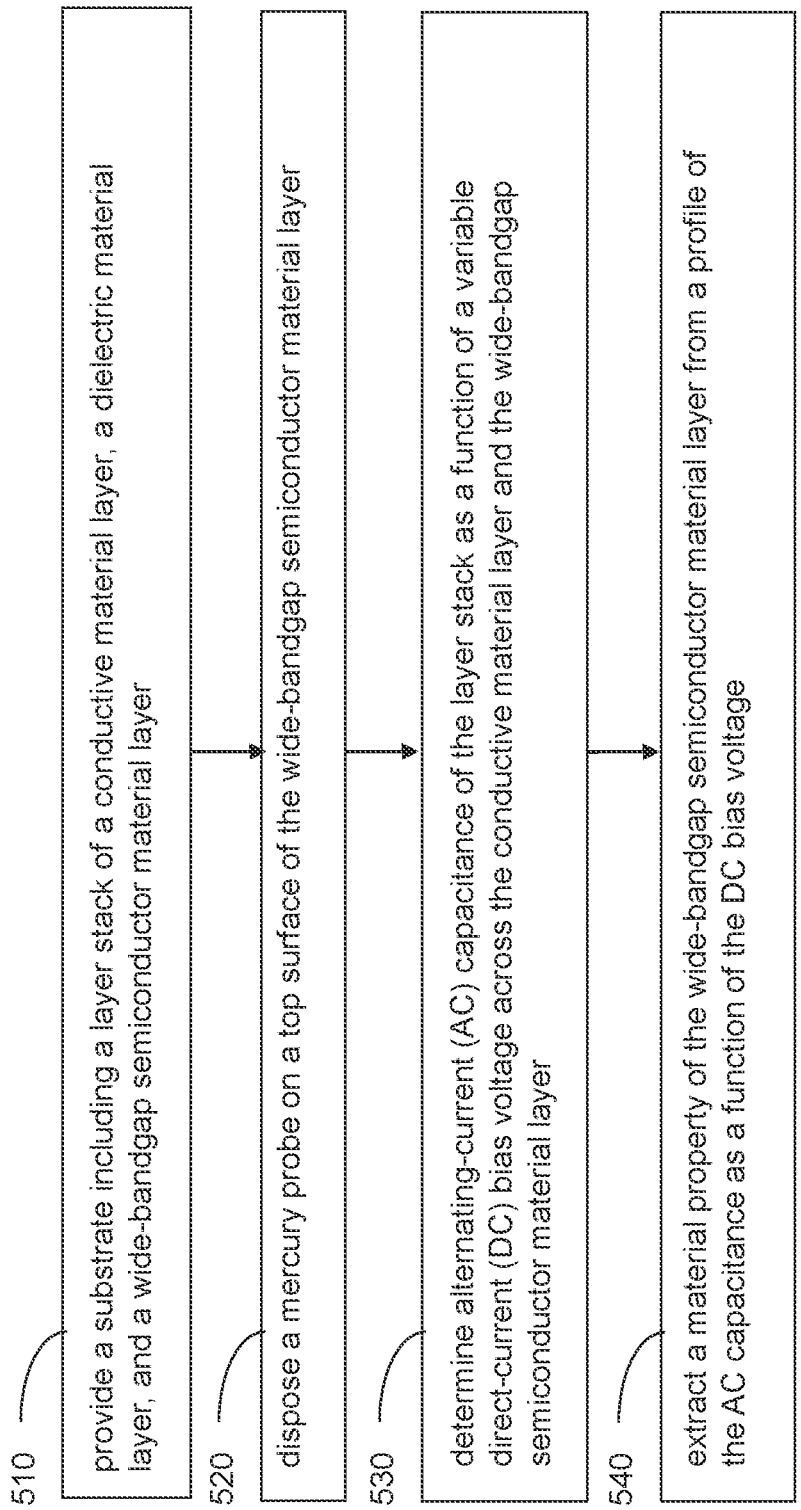
FIG. 5 is a flowchart that illustrates a set of processing steps for characterizing a wide-bandgap semiconductor material according to an embodiment of the present disclosure.

Referring to FIG. 5, a flowchart that illustrates a set of processing steps for characterizing a wide-bandgap semiconductor material according to an embodiment of the present disclosure.

Referring to step 510 and FIG. 2, a substrate (such as a wafer 100) is provided, which includes a layer stack of a conductive material layer 110, a dielectric material layer 120, and a wide-bandgap semiconductor material layer (such a compound semiconductor material layer 130). The wide-bandgap semiconductor material layer comprises a semiconductor material having a band gap of 2.0 eV or greater.

Referring to step 520 and FIG. 2, a mercury probe (930, 940) may be disposed on a top surface of the wide-bandgap semiconductor material layer.

Referring to step 530 and FIG. 2, alternating-current (AC) capacitance of the layer stack is determined as a function of a variable direct-current (DC) bias voltage across the conductive material layer 110 and the wide-bandgap semiconductor material layer, for example, by performing the measurement steps described above. A set of AC capacitance curves measured at different value of frequency for sinusoidal AC perturbation voltage may be generated.

Referring to step 540 and FIGS. 3 and 4, a material property of the wide-bandgap semiconductor material layer may be extracted from a profile of the AC capacitance as a function of the DC bias voltage.

Figure 6:
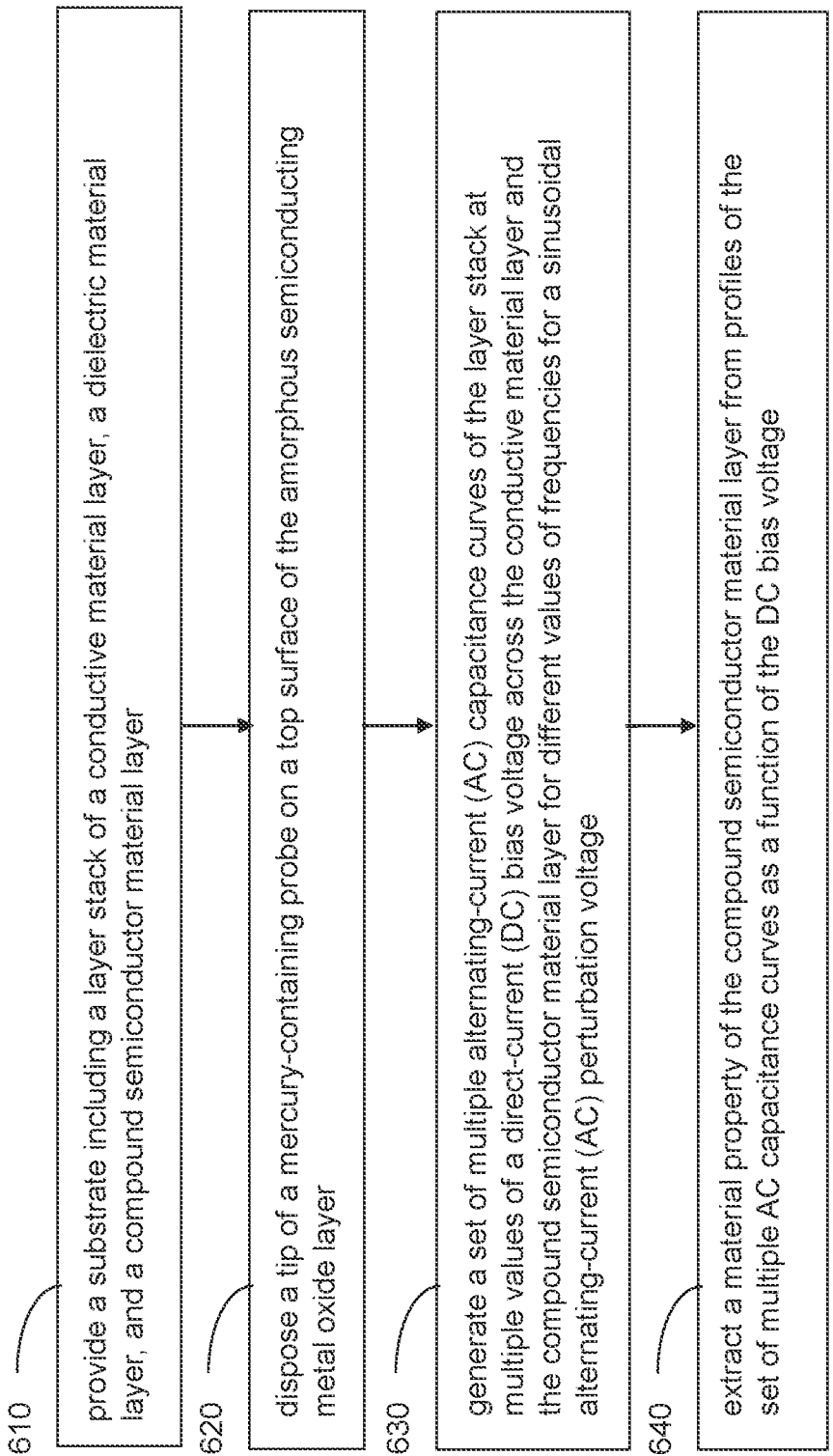
FIG. 6 is a flowchart that illustrates a set of processing steps for characterizing a compound semiconductor material according to an embodiment of the present disclosure.

Referring to FIG. 6, a flowchart illustrates a set of processing steps for characterizing a compound semiconductor material according to an embodiment of the present disclosure.

Referring to step 610 and FIG. 2, a substrate (such as a wafer 100) is provided, which includes a layer stack of a conductive material layer 110, a dielectric material layer 120, and a compound semiconductor material layer 130.

Referring to step 620 and FIG. 2, a tip of a mercury probe (930, 940) is disposed on a top surface of the compound semiconductor material layer 130.

Referring to step 630 and FIG. 2, a set of multiple alternating-current (AC) capacitance curves of the layer stack (110, 120, 130) is generated at multiple values of a direct-current (DC) bias voltage across the conductive material layer 110 and the compound semiconductor material layer 130 for different values of frequencies for a sinusoidal alternating-current (AC) perturbation voltage. In one embodiment, the different values of the frequencies for the sinusoidal AC perturbation voltage may comprise at least a first frequency in a range from 10 Hz to 1 kHz and a second frequency in a range from 1 MHz to 1 GHz.

Referring to step 640 and FIGS. 3 and 4, a material property of the wide-bandgap semiconductor material layer from profiles of the set of multiple AC capacitance curves as a function of the DC bias voltage. In one embodiment, the material property comprises a free charge carrier concentration within the compound semiconductor material layer.

Figure 7:
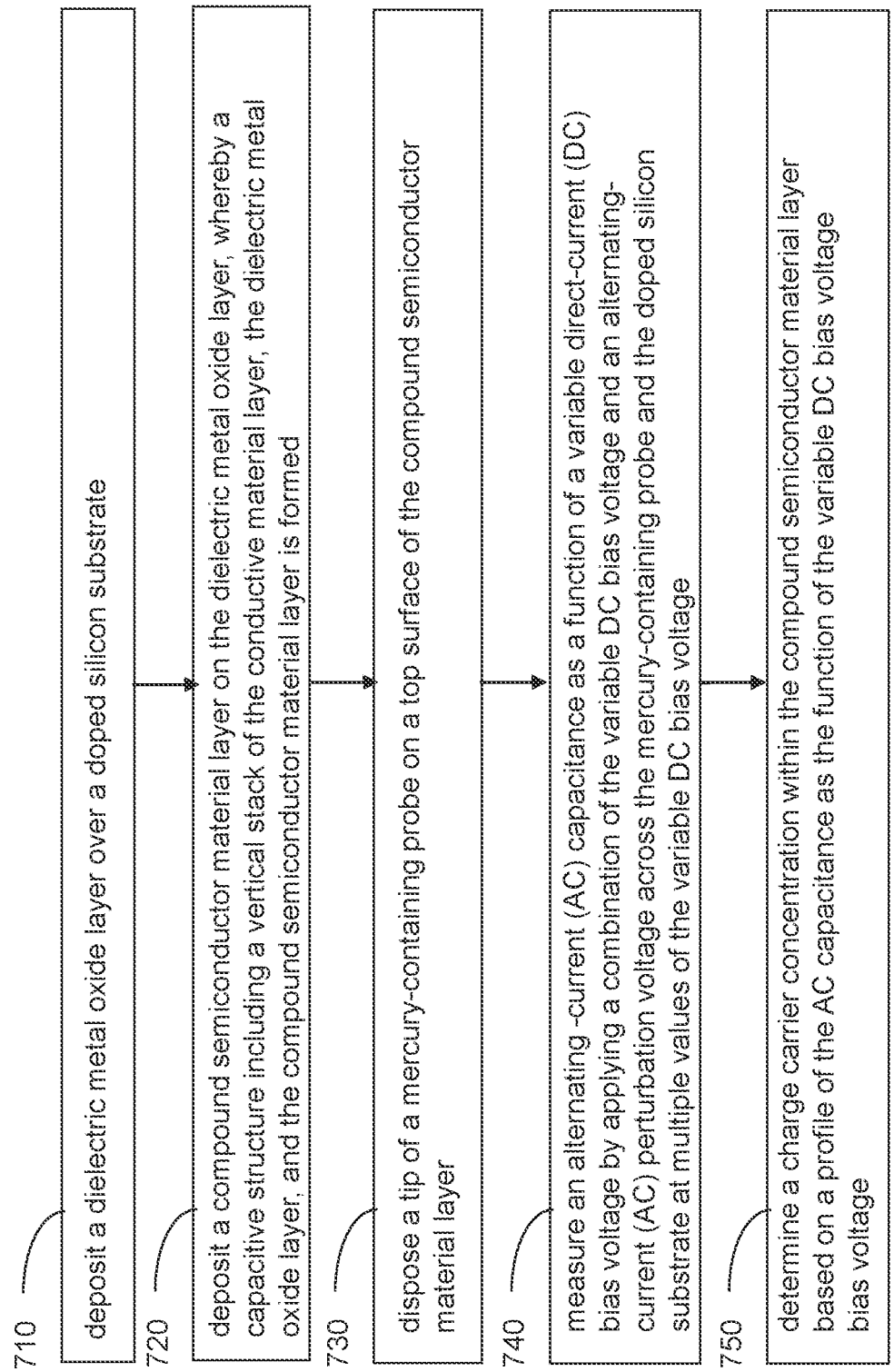
FIG. 7 is a flowchart that illustrates another set of processing steps for characterizing a compound semiconductor material according to an embodiment of the present disclosure.

Referring to FIG. 7, a flowchart illustrates another set of processing steps for characterizing a compound semiconductor material according to an embodiment of the present disclosure.

Referring to step 710 and FIG. 2, a dielectric metal oxide layer (including a dielectric material layer 120) is deposited over a doped silicon substrate (including a conductive material layer 110).

Referring to step 720 and FIG. 2, a compound semiconductor material layer 130 is deposited on the dielectric metal oxide layer, whereby a capacitive structure including a vertical stack of the conductive material layer 110, the dielectric metal oxide layer, and the compound semiconductor material layer 130 is formed.

Referring to step 730 and FIG. 2, a tip of a mercury probe (930, 940) is disposed on a top surface of the compound semiconductor material layer 130.

Referring to step 740 and FIG. 2, an alternating-current (AC) capacitance is measured as a function of a variable direct-current (DC) bias voltage by applying a combination of the variable DC bias voltage and an alternating-current (AC) perturbation voltage across the mercury probe (930, 940) and the doped silicon substrate at multiple values of the variable DC bias voltage.

Referring to step 750 and FIGS. 3 and 4, a charge carrier concentration within the compound semiconductor material layer 130 may be determined based on a profile of the AC capacitance as the function of the variable DC bias voltage.

The methods of the present disclosure provide stable low-resistance contact between a wide-bandgap semiconductor material and a contact probe, thereby enabling reliable high signal-to-noise ratio AC capacitance measurements on a layer stack including a conductive material layer 110, a dielectric material layer 120, and a wide-bandgap semiconductor material layer (such as a compound semiconductor material layer 130). Multiple frequencies may be used for the AC perturbation voltage during the AC capacitance measurement such that at least one frequency is less than 1 kHz (such as less than 100 Hz), and at least another frequency is greater than 1 MHz (such as greater than 10 MHz and/or greater than 100 MHz). Material properties of the compound semiconductor material layer 130 may be extracted from features within a set of AC capacitance curves, such as the features in the inversion mode. Extraction of the material properties may be performed using a heavily-doped silicon wafer as the conductive material layer 110. In this embodiment, the dielectric material layer 120 and the wide-bandgap semiconductor material layer may be deposited as unpatterned material layers, and the methods of the present disclosure may be used for prompt extraction of the material properties of the wide-bandgap semiconductor material layer without using any lithographic steps, i.e., without patterning any film. Thus, the methods of the present disclosure provide a fast and economical way of monitoring film properties for deposition processes that deposits a wide-bandgap semiconductor material.

The methods of the present disclosure does not require a single crystalline semiconductor material layer as a compound semiconductor material layer 130 of the capacitor structure. Thus, the compound semiconductor material layer 130 may be amorphous, microcrystalline, polycrystalline, or single crystalline, and the material properties of the amorphous, microcrystalline, polycrystalline, or single crystalline compound semiconductor material may be extracted from the compound semiconductor material layer 130 without concern for contact resistance issues due to the low contact resistance to the compound semiconductor material layer 130 that is enabled by the mercury probe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of characterizing a wide-bandgap semiconductor material, comprising:
providing a substrate which contains a capacitor structure including a layer stack of a first electrode as embodied as a conductive material layer, a node dielectric as embodied as a dielectric material layer, and a second electrode as embodied as a wide-bandgap semiconductor material layer;
disposing a tip of a mercury probe on the top surface of the wide-bandgap semiconductor material layer;
generating a set of multiple alternating-current (AC) capacitance curves of the layer stack that represents a change in AC capacitance as a function of a change in a direct-current (DC) bias voltage across the conductive material layer and the wide bandgap semiconductor material layer by applying a combination of the DC bias voltage and a sinusoidal alternating-current (AC) perturbation voltage across the layer stack, wherein the multiple AC capacitance curves are generated using different frequencies for the sinusoidal AC perturbation voltage; and
determining a structural parameter of the wide-bandgap semiconductor material layer which is selected from porosity, crystallinity, stoichiometry, and thickness by correlating observed features within the set of multiple AC capacitance curves with the structural parameter using a database containing information on previously-established correlation between features among sets of multiple AC capacitance curves and structural parameters of a reference compound semiconductor material layer having a same base composition as the wide-bandgap semiconductor material layer in the layer stack.

2. The method of claim 1, wherein:
the mercury probe comprises a pillar of mercury that is contained in a capillary tube; and
the pillar of mercury is in direct contact with the top surface of the wide-bandgap semiconductor material layer.

3. The method of claim 2, wherein a contact area between the pillar of mercury and the top surface of the wide-bandgap semiconductor material layer is in a range from 0.5 mm$^2$ to 10 mm$^2$.

4. The method of claim 1, wherein one of the frequencies for the sinusoidal AC perturbation voltage comprises a sinusoidal perturbation voltage having a frequency in a range from 10 Hz to 1 GHz.

5. The method of claim 1, wherein the AC perturbation voltage for generating one of the multiple AC capacitance curves has an amplitude in a range from 5 mV to 50 mV.

6. The method of claim 5, wherein the variable DC bias voltage has a minimum voltage that is less than −2 V and has a maximum voltage that is greater than 2 V.

7. The method of claim 1, wherein the conductive material layer comprises a doped single crystalline semiconductor material layer or a doped polycrystalline semiconductor material layer.

8. The method of claim 7, wherein the doped single crystalline semiconductor material layer or the doped polycrystalline semiconductor material layer comprises p-type dopants or n-type dopants at an atomic concentration in a range from $5.0\times10^{19}$/cm$^3$ to $2.0\times10^{21}$/cm$^3$.

9. The method of claim 1, wherein the dielectric material layer comprises a dielectric metal oxide material having a dielectric constant greater than 7.9 and has a thickness in a range from 1.5 nm to 30 nm.

10. The method of claim 1, wherein the structural parameter is porosity, crystallinity, or stoichiometry.

11. The method of claim 1, wherein:
the structural parameter is thickness;
the method comprises measuring sheet resistance of the wide band-gap semiconductor material layer using a different measurement technique, and extracting resistivity of the wide band-gap semiconductor material layer using the database; and the thickness is calculated from the sheet resistance and the resistivity.

12. The method of claim 1, wherein each frequency among the different frequencies for the sinusoidal AC perturbation voltage differ from all other frequencies for the sinusoidal AC perturbation voltage at least by a factor of 10.

13. The method of claim 1, further comprising increasing a contact area between mercury and the compound semiconductor material layer by lower a pillar of mercury within the tip of the mercury probe.

14. A method of characterizing a compound semiconductor material, comprising;
 providing a substrate which contains a capacitor structure including a layer stack of a first electrode as embodied as a conductive material layer, a node dielectric as embodied as a dielectric material layer, and a second electrode as embodied as a compound semiconductor material layer;
 disposing a tip of a mercury probe on a top surface of the compound semiconductor material layer;
 generating a set of multiple alternating-current (AC) capacitance curves of the layer stack that represents a change in AC capacitance as a function of a change in a direct-current (DC) bias voltage across the conductive material layer and the compound semiconductor material layer by applying a combination of the DC bias voltage and a sinusoidal alternating-current (AC) perturbation voltage across the layer stack, wherein the multiple AC capacitance curves are generated using different frequencies for the sinusoidal AC perturbation voltage; and
 determining a structural parameter of the compound semiconductor material layer which is selected from porosity, crystallinity, stoichiometry, and thickness by correlating observed features within the set of multiple AC capacitance curves with the structural parameter using a database containing information on previously-established correlation between features among sets of multiple AC capacitance curves and structural parameters of a reference compound semiconductor material layer having a same base composition as the compound semiconductor material layer in the layer stack.

15. The method of claim 14, wherein the different frequencies for the sinusoidal AC perturbation voltage comprises a first frequency in a range from 10 Hz to 1 kHz and a second frequency in a range from 1 MHz to 1 GHz.

16. The method of claim 14, wherein the compound semiconductor material layer has a uniform thickness throughout, comprises a material selected from indium gallium zinc oxide (IGZO), tin indium gallium zinc oxide, silicon-doped IGZO, indium tungsten oxide, indium zinc oxide, gallium zinc oxide, indium tin oxide, tin germanium oxide, gallium oxide, indium oxide, zinc oxide, doped indium oxide (such as tungsten-doped indium oxide), doped cadmium oxide, nickel oxide, tin oxide, copper oxide, gallium nitride, aluminum gallium arsenide, gallium arsenide, indium gallium arsenide, silicon carbide, and compounds thereof, and comprises free charge carriers at an atomic concentration in a range from $1.0 \times 10^{15}/cm^3$ to $1.0 \times 10^{21}/cm^3$.

17. A method of characterizing a compound semiconductor material, comprising;
 depositing a dielectric metal oxide layer over a conductive material layer;
 depositing a compound semiconductor material layer on the dielectric metal oxide layer, whereby a wafer which contains a capacitor structure including a vertical stack of a first electrode as embodied as the conductive material layer, a node dielectric as embodied as the dielectric metal oxide layer, and a second electrode as embodied as the compound semiconductor material layer;
 disposing a tip of a mercury probe on a top surface of the compound semiconductor material layer;
 generating a set of multiple alternating-current (AC) capacitance curves of the layer stack that represents a change in AC capacitance as a function of a change in a direct-current (DC) bias voltage across the conductive material layer and the compound semiconductor material layer by applying a combination of the DC bias voltage and a sinusoidal alternating-current (AC) perturbation voltage across the layer stack, wherein the multiple AC capacitance curves are generated using different frequencies for the sinusoidal AC perturbation voltage; and
 determining a structural parameter of the compound semiconductor material layer which is selected from porosity, crystallinity, stoichiometry, and thickness by correlating observed features within the set of multiple AC capacitance curves with the structural parameter using a database containing information on previously-established correlation between features among sets of multiple AC capacitance curves and structural parameters of a reference compound semiconductor material layer having a same base composition as the compound semiconductor material layer in the layer stack.

18. The method of claim 17, wherein the conductive material layer comprises a doped semiconductor material layer including p-type dopants or n-type dopants at an atomic concentration in a range from $5.0 \times 10^{19}/cm^3$ to $2.0 \times 10^{21}/cm^3$.

19. The method of claim 18, wherein the compound semiconductor material layer has a uniform thickness throughout and comprises free charge carriers at an atomic concentration that is less than the atomic concentration of the p-type dopants or the n-type dopants within the doped semiconductor material layer.

20. The method of claim 17, wherein:
 the AC perturbation voltage comprises a sinusoidal perturbation voltage having a frequency in a range from 10 Hz to 1 GHz; and the AC perturbation voltage has an amplitude in a range from 5 mV to 50 mV.

* * * * *